United States Patent [19]

Hollingsead et al.

[11] 4,044,515
[45] * Aug. 30, 1977

[54] GASKET FOR AN AVIONIC TRAY

[75] Inventors: Robert A. Hollingsead, Yorba Linda; Clyde Robert Pryor, Anaheim, both of Calif.

[73] Assignee: Hollingsead-Pryor Enterprises, Inc., Santa Fe Springs, Calif.

[*] Notice: The portion of the term of this patent subsequent to Nov. 6, 1990, has been disclaimed.

[21] Appl. No.: 528,027

[22] Filed: Nov. 29, 1974

Related U.S. Application Data

[62] Division of Ser. No. 399,961, Sept. 24, 1973, Pat. No. 3,871,937, which is a division of Ser. No. 125,561, March 18, 1971, Pat. No. 3,771,023.

[51] Int. Cl.² .................... H05K 7/20; E04B 1/62
[52] U.S. Cl. .................... 52/173 R; 49/485; 49/489; 52/400; 277/178; 361/383
[58] Field of Search ............ 52/208, 123, 393–403; 49/498, 488, 485; 317/100; 277/178, 226

[56] References Cited

U.S. PATENT DOCUMENTS

| 2,077,686 | 4/1937 | Gober | 174/153 G |
|---|---|---|---|
| 2,176,143 | 10/1939 | Miller | 52/400 X |
| 2,430,873 | 11/1947 | Haas | 52/398 X |
| 2,607,966 | 8/1952 | Beck | 277/226 X |
| 2,624,614 | 1/1953 | Kramer | 52/400 |
| 2,659,941 | 11/1953 | Beck | 49/498 X |
| 2,736,404 | 2/1956 | Clingman | 52/400 |
| 3,078,119 | 2/1963 | Premo et al. | 52/400 |
| 3,082,470 | 3/1963 | Fork | 174/153 G X |
| 3,191,988 | 6/1965 | Sturtevant et al. | 52/400 |
| 3,309,817 | 3/1967 | Fisher | 49/498 X |
| 3,541,395 | 11/1970 | Lucchino | 317/100 |
| 3,672,109 | 6/1972 | Erck | 52/400 |
| 3,771,023 | 11/1973 | Hollingsead et al. | 277/178 X |
| 3,871,937 | 3/1975 | Hollingsead et al. | 277/178 X |

FOREIGN PATENT DOCUMENTS

| 1,010,426 | 3/1952 | France | 52/397 |
|---|---|---|---|
| 1,221,758 | 1/1960 | France | 52/397 |

Primary Examiner—Alfred C. Perham
Attorney, Agent, or Firm—Jackson & Jones Law Corporation

[57] ABSTRACT

An avionic tray is disclosed for supporting electronic instruments on a shelf. The tray includes an aperture formed thereon for providing the supporting instrument with communication to an air plenum chamber. An interchangeable metering plate is adapted to extend over the aperture, with the plate having a predetermined number of metering ports formed thereon in any desired arrangement. The metering plate is interconnected to the aperture by means of a removable annular gasket, which in turn sealingly engages a surface of the electronic instrument. The gasket includes a pair of annular grooves for receiving the peripheral edges of the metering plate and the tray aperture. The gasket is constructed in such a manner that any application of a downward or lateral force on the gasket by the supported instrument causes the metering plate to be forced against the rim of the aperture to tightly hold the portion of the gasket between the two elements and prevent the gasket from becoming disengaged.

13 Claims, 2 Drawing Figures

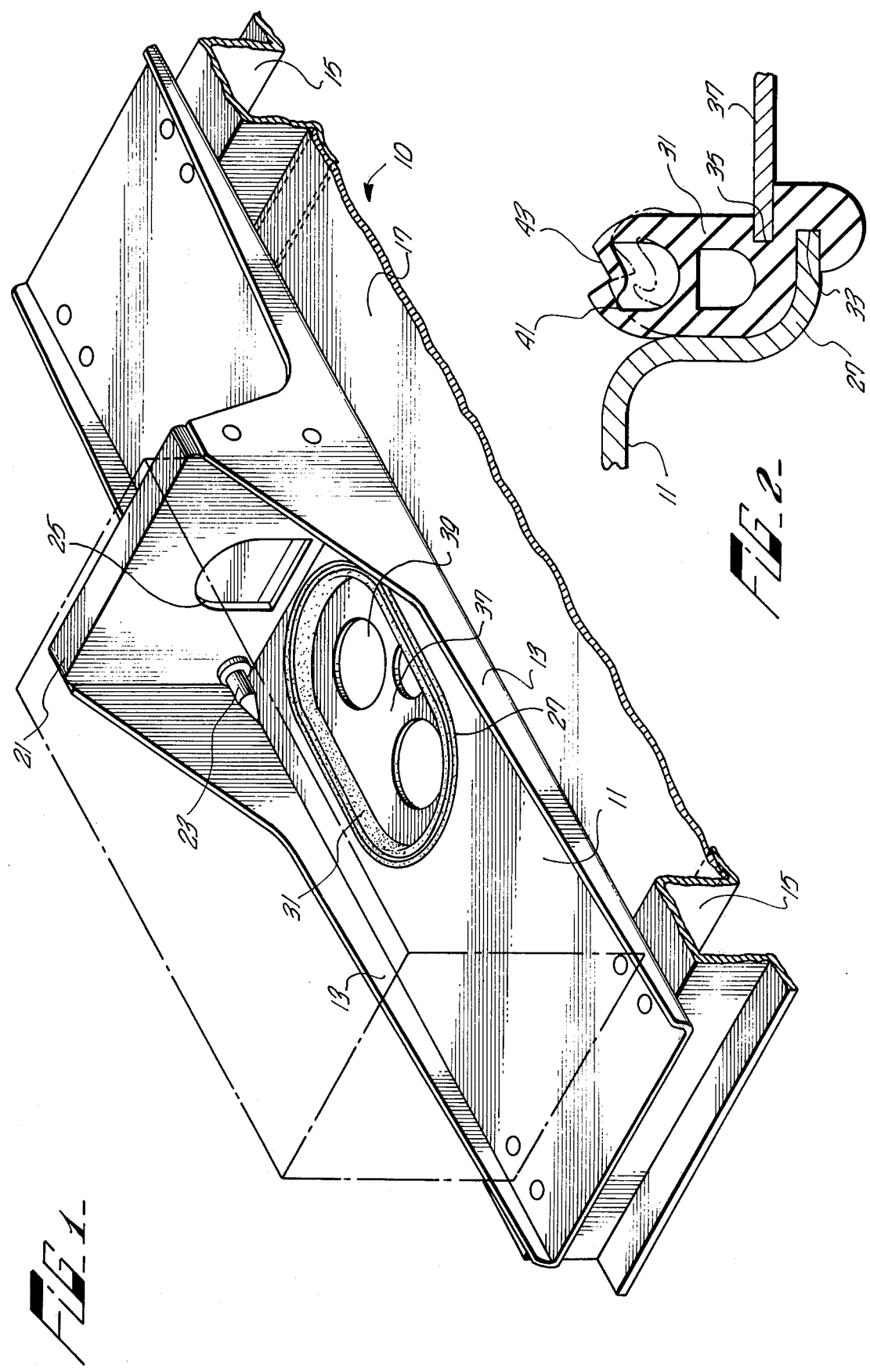

GASKET FOR AN AVIONIC TRAY

CROSS-REFERENCE TO RELATED APPLICATIONS:

This is a divisional application of prior application Ser. No. 399,961, filed on Sept. 24, 1973 now U.S. Pat. No. 3,871,937, which application is a divisional application of prior application Ser. No. 125,561, filed on Mar. 18, 1971 now U.S. Pat. No. 3,771,023.

BACKGROUND OF THE INVENTION:

1. Field of the Invention

The present invention relates to avionic racking, and more particularly to an annular gasket utilized in mounting metering plates and sealing the electronic instruments on shelves.

2. Description of the Prior Art

In an aircraft, each piece of electronic equipment is supported on an individual tray which, in turn, is supported at its front and back ends on a pair of cross beams. The trays are made in standard ATR widths to accommodate the various sizes of instruments. In a typical shelf, the plurality of trays are closely spaced on the cross beams to completely enclose the entire length of the shelf. A closure plate is positioned beneath the cross beams to completely enclose the area directly below the trays to form an air plenum chamber. The air plenum chamber of each shelf then communicates with a vertical manifold, located at the ends of the shelves, which in turn is connected to a vacuum system.

The outer casing of each instrument is provided with standard air vents at the top and bottom sides to permit cooling air to be drawn therethrough. Each tray includes a pocket formed below the main surface thereof, with the pocket having a plurality of metering ports defined therein to enable the supported instrument to communicate with the air plenum chamber. Finally, an annular gasket is bonded to the bottom surface of the pocket of each tray about the periphery of the aperture with the upper portion of the gasket extending out of the pocket above the main surface of the tray to sealingly engage the bottom of the instrument supported thereon. In this manner, air from beneath the instrument is prevented from leaking into the air plenum chamber. As a result, the only cooling air drawn into the system is vented through the instruments.

Although these trays have been used extensively in a great number of aircraft, they still suffer from various shortcomings which severely hamper their utilization.

A serious problem is encountered when the instrument is installed on the tray. During such installation, the back end of the instrument is placed on the tray and shoved rearwardly until it contacts the backplate on the tray. However, during such movement, the bottom edge of the instrument contacts the exposed portion of the gasket extending above the surface of the tray. Quite often, this engagement causes the gasket to be torn away from its bonded seat on the tray. When this occurs, the gasket becomes twisted and entangled within the pocket. This unseating of the gasket not only causes leakage into the air plenum chamber from the area beneath the supported instrument, but the entanglement also causes misalignment of the supported instrument with the tray backplate and the electrical connections mounted thereon.

Another shortcoming with the prior trays is that if it is desired to change the porting arrangement in the tray because of different cooling requirements, the entire tray has to be replaced with one having the desired porting arrangement. Not only is this inconvenient because an extra supply of trays which must be kept by the user, but the storing of extra trays also involved an even greater expense.

SUMMARY OF THE INVENTION

The present invention obviates the above-mentioned shortcomings by providing a tray having an improved gasket structure which is removably mounted on the tray and is constructed to ensure an air-tight seal between the tray and the instrument at all times. The tray comprises a bottom section and a pair of side rails extending upwardly along the lateral edges thereof. An annular rim is formed on the bottom section of the tray in a pocket extending below the bottom supporting surface of the tray. an interchangeable metering plate, having a predetermined number of metering ports formed thereon in any desired arrangement, is provided to extend over the annular rim of the tray. The metering plate is interconnected to the annular rim by means of a removable annular gasket. The annular gasket is connected to the tray by means of a lower groove formed about the outer periphery thereof which is adapted to receive the peripheral edge of the annular rim. The connection to the metering plate is accomplished with an upper groove formed about the inner periphery thereof which is adapted to receive the peripheral edge of the metering plate. The top portion of the gasket extends above the bottom supporting surface of the tray to sealingly engage the bottom surface of the supported instrument. The gasket is constructed in such a manner that any application of a downward or lateral force on the top portion of the gasket causes the metering plate to be forced downward against the annular rim of the tray to tightly hold that portion of the gasket between the two elements and prevent the gasket from becoming disengaged and entangled.

The interchangeable metering plate is provided with any amount of metering ports positioned in any desired arrangement to accommodate any cooling requirement.

The primary advantage of the present invention is that the improved gasket does not become disengaged with the annular rim of the tray upon installation of the instrument. In fact, the gasket actually becomes more tightly secured upon a lateral or downward force of the instrument.

Another advantage of the present invention is that the gasket is removable and can be inserted and removed from the tray without any special tools.

Another advantage of the present invention is that the interchangeable metering plates can be easily removed from the gasket retention to permit a wide range of porting arrangements to be utilized without the necessity of changing the entire tray.

The features of the present invention which are believed to be noval are set forth with particularity in the appended claims. The present invention, both as to its organization and manner of operation, together with further objects and advantages thereof, may best be understood by reference to the following description, taken in connection with the accompanying drawings.

BRIEF DESCRIPTION OF THE DRAWINGS

FIG. 1 is a perspective view of the improved avionic tray in accordance with the present invention; and FIG. 2 is an enlarged sectional view of the gasket interconnecting the metering plate to the tray.

DESCRIPTION OF THE PREFERRED EMBODIMENT

Referring now to the drawings, FIG. 1 shows an avionic tray, generally indicated by arrow 10, for supporting an electronic instrument (shown in broken lines). The tray 10 comprises a bottom section 11 and a pair of side rails 13 extending upwardly along the lateral edges thereof. The bottom section 11 is adapted to be mounted at its ends to a pair of cross-channels 15 with the entire length of the channels 15 being covered with similar trays to form a shelf. A closure plate 17 is connected to the bottom of the cross-channels to completely enclose the space below the trays 10 to form an air plenum chamber. The air plenum chamber is connected to a manifold (not shown) at one end of the shelf in the conventional manner.

The side rails 13 function as a guide for the supported instrument and as a support for a backplate 21. The backplate 21 includes a pair of guide pins 23 for receiving the mating portion of the instrument and a cut-out portion 25 for receiving an electrical receptacle (not shown) which is adapted to receivingly engage the plug portion of the instrument.

An annular rim 27 is also formed in the bottom section 11 of the tray in a pocket extending below the supporting surface of the tray. A removable annular gasket 31 is provided to extend around the periphery of the rim 27. The gasket 31 is preferably formed from a length of extruded silicone rubber which is cut and bonded at its end to form an oval.

As shown in FIG. 2, the gasket 31 has a lower annular groove 33 formed about the outer periphery thereof which is adapted to receive the peripheral edge of the annular rim 27 for connection therewith. The gasket 31 also has an upper annular groove 35 formed about the inner periphery thereof which is adapted to receive the peripheral edge of the annular rim 27 for connection therewith. The gasket 31 also has an upper annular groove 35 formed about the inner periphery thereof which is adapted to receive the peripheral edge of a metering plate 37 for connection therewith. The metering plate 37 includes a plurality of metering ports 39 for controlling the amount of air to be drawn through the instrument. An important advantage of the metering plate 37 is that it can be detachably removed from the gasket 31 in order to insert other metering plates having a different number of ports in a different arrangement depending on the cooling requirements.

As shown in FIG. 2, the top portion of the gasket 31 extends above the supporting surface of the bottom section 11 sealingly engage the bottom surface of the instrument. A pair of annular chambers or passageways 41 is formed within the seal with the top portion of the seal 31 also having an angular V-shaped groove 43 formed thereon.

The sealing surface means defines a concave annular sealing surface forming a pair of radially spaced sealing contact surfaces. The first annular passageway adjacent the sealing surface includes a cross-sectional convex configuration which provides roughly an M shape to the upper portion of the gasket 31.

Upon installing the instrument on the tray 10, the front bottom portion of the modular equipment instrument is placed in the tray 10 between the side rails 13 and slid rearwardly until the rear of the instrument contacts the backplate 21 to make an electrical connection with the sockets mounted on the backplate. However, upon progressing toward the rear of the tray 10, the rear bottom portion of the instrument contacts the exposed portion of the gasket 31. When this occurs, a rearward and downward force is applied to the top portion of the gasket 31. In accordance with the present invention, this rearward and downward force causes the top portion of the gasket 31 to bend over the upper groove 35 supporting the metering plate 37 (as shown in broken lines in FIG. 2). The downward force tends to drive the peripheral edge of the metering plate 37 downwardly. However, because the metering plate 37 is dimensionally larger than annular rim 27, the frontal edge of the metering plate 37 is forced downwardly to bottom out against the peripheral edge of the annular rim 27. The upper and lower grooves 33 and 35 are aligned generally parallel in the gasket 31 and the depth of the first groove 33 overlaps the depth of the second groove 35. As a result, the portion of the gasket 31 between these two elements is locked into position in such a manner that the greater the applied force by the instrument, the greater the metering plate 37 applies a holding force on the gasket 31. The top groove 43 bends the top of the gasket 31 in such a manner as to maintain it at a constant level as the instrument travels over it.

If it is desired to interchange the metering plate 37, the plate 37 can be easily snapped out of the annular groove 35 by forcing the plate upwardly. After which a new metering plate having a different porting arrangement can then be easily inserted into the groove 35. The reason for this is that there are many varied requirements for cooling various types of electronic equipment. The total amount of cooling through each plate would depend on the total area of the metering ports. Moreover, it is often important to localize the cooling to certain areas of the equipment such as either the front or side portion. Therefore, not only is the port size important, but port location is equally critical.

An important advantage of the present invention is that the gasket 31 need not be glued to the tray but can be easily inserted and detached therefrom without the use of a tool. Moreover, improved gasket contruction permits temporary deflection and increased bending without degradation of the sealing force against the instrument bottom.

A further advantage of the present invention is that only the metering plate need be changed when a new piece of equipment is utilized. Prior to the present invention, the entire tray had to be substituted in such instances.

As can be seen, an avionic tray is provided having novel sealing and porting means which is easy to operate and much more dependable in operation.

It should be noted that various modifications can be made to the apparatus while still remaining within the purview of the following claims. For example, it may be desired to enlarge the side rails 13 to permit the cooling aperture to extend therethrough instead of through the bottom section 11. In this modification, an air plenum chamber would extend upwardly adjacent the side rail to communicate with the aperture.

What is claimed is:

1. A gasket for use in an avionic tray having an apertured rim and a removable metering plate comprising:
    an annular flexible gasket body member having an inner and outer side and a first hollow annular passageway;

means defining a first groove on the outer side of the gasket body member for receiving the apertured rim;

means defining a second groove above the first groove on the inner side of the gasket body member for detachably receiving the metering plate, the first and second grooves being generally parallel and, the depth of the first groove into the gasket body member overlaps the depth of the second groove into the gasket body member; and means defining a concave annular sealing surface extending above the second groove, immediately above the first annular passageway and generally parallel therewith for wedging the metering plate in the second groove towards the apertured rim in the first groove when a force is exerted on the same side of the sealing surface means as the first groove whereby the gasket body member is progressively locked tighter between the rim and the metering plate as the force increases, the first annular passageway surface configuration permits a deformational movement of the gasket body member by any force applied against the sealing surface area of the gasket body member while maintaining a continual planar sealing surface throughout the length of the gasket body member.

2. The invention of claim 1 wherein the gasket member is formed of silicone rubber.

3. The invention of claim 1 wherein the sealing surface comprises a V-shaped groove having a pair of radially spaced sealing contact surfaces along the annular body member.

4. The invention of claim 3 wherein the first hollow passageway extends below the sealing surface and above the second groove.

5. The invention of claim 1 wherein the body member defines a second hollow annular passageway between the second groove and the first passageway.

6. The invention of claim 5 wherein the first annular passageway surface configuration has a cross-sectional convex configuration which permits a deformational closing of annular passageway area while maintaining a constant sealing surface plane even when the gasket body member forms an oblong shape.

7. In an avionic tray assembly supporting removable modular equipment such as electronic instruments having a support surface and a recessed apertured rim below the support surface, relative to the equipment, and a removable metering plate, the improvement comprising:

an annular flexible gasket body member having an inner and outer side;

means defining a first groove on the outer side of the gasket body member for receiving the apertured rim of the tray;

means defining a second groove above the first groove on the inner side of the gasket body member for detachably receiving the metering plate; and means for defining an annular planar sealing surface extending above the second groove and further extending above the adjacent tray support surface, for wedging the metering plate in the second groove towards the apertured rim in the first groove when a force is exerted on the same side of the sealing surface means as the first groove and cooperating with the gasket body member for progressively tightening the seal between the gasket body member, the rim and the metering plate as the force increases, while maintaining said sealing surface continuously planar.

8. The invention of claim 7 wherein the annular sealing surface has a V-shaped groove forming a pair of radially spaced sealing contact surfaces, and a first annular passageway surface configuration including a cross-sectional convex configuration which predisposes any deformational closing of the annular passageway area by a force from the modular equipment so that a constant planar sealing surface is maintained.

9. The invention of claim 7 wherein the first and second grooves are aligned generally parallel in the gasket body member and the depth of the first groove into the gasket body member overlaps the depth of the second groove into the gasket body member.

10. The invention of claim 8 wherein the first and second grooves are aligned generally parallel in the gasket body member and the depth of the first groove into the gasket body member overlaps the depth of the second groove into the gasket body member.

11. The invention of claim 8 wherein the first annular passageway forms an M cross-sectional shape.

12. In a gasket for sealing between several members including the edge of a first apertured surface recessed from a second substantially planar surface, a plate disposed within the recess defined by said first and second surfaces and a third surface overslidably insertable on said second surface, the combination comprising:

an outer side stepped in shape to occupy said recess, the step leading to a first groove penetrating into the side of said gasket;

an inner side stepped in shape, the step in the inner side being above the step on the outer side and leading to a second groove penetrating into the gasket to a depth overlapping the depth of penetration of said first groove; and a top portion joining said inner and outer sides at a height sufficient to rise slightly above said second surface and having a hollow passageway therein.

13. A gasket for sealing between several members including the edge of a first apertured surface attached to and recessed from a second surface, a plate disposed within the recess defined by said first and second surfaces and a third surface overslidably insertable on said second surface, said gasket comprising:

means for sealably abutting said third surface and at least partially encompassing the edge of said apertured surface and the edge of said plate and for reacting to the oversliding of said third surface to increase the sealing forces on the edge of said apertured surface and the edge of said plate.

* * * * *